United States Patent
Cai et al.

(10) Patent No.: US 10,995,787 B2
(45) Date of Patent: May 4, 2021

(54) QUICK LOCKING PIECE AND DISPLAY SCREEN ASSEMBLY

(71) Applicant: ROE Visual Co., Ltd., Guangdong (CN)

(72) Inventors: Danhu Cai, Guangdong (CN); Zhanqiang Li, Guangdong (CN); Yongfei Yu, Guangdong (CN); Shunwen Tian, Guangdong (CN); Chen Lu, Guangdong (CN); Dries Vermeulen, Guangdong (CN)

(73) Assignee: ROE Visual Co., Ltd., Shenzhen (CN)

( * ) Notice: Subject to any disclaimer, the term of this patent is extended or adjusted under 35 U.S.C. 154(b) by 429 days.

(21) Appl. No.: 16/070,289

(22) PCT Filed: Dec. 29, 2017

(86) PCT No.: PCT/CN2017/119898
§ 371 (c)(1),
(2) Date: Jul. 16, 2018

(87) PCT Pub. No.: WO2018/214504
PCT Pub. Date: Nov. 29, 2018

(65) Prior Publication Data
US 2019/0316623 A1 Oct. 17, 2019

(30) Foreign Application Priority Data
May 24, 2017 (CN) .......................... 201710373226.X

(51) Int. Cl.
*H05K 7/00* (2006.01)
*F16B 21/04* (2006.01)
(Continued)

(52) U.S. Cl.
CPC ................ *F16B 21/04* (2013.01); *F16B 9/02* (2013.01); *H05K 5/0017* (2013.01);
(Continued)

(58) Field of Classification Search
USPC .......................................... 361/747
See application file for complete search history.

(56) References Cited

U.S. PATENT DOCUMENTS 5,280,973 A * 1/1994 Culling ............... E05B 17/0025
  292/342
7,117,563 B2 * 10/2006 Chen ..................... G06F 1/1616
  16/330
(Continued)

*Primary Examiner* — Hung S. Bui

(57) ABSTRACT

The present invention discloses a quick locking piece, comprising a shaft sleeve and a rotary shaft which are cooperatively installed; the rotary shaft has a locked section and a sliding section, and the locked section is located at one end portion of the rotary shaft; an outer contour surface of the sliding section is provided with a first guide slot for guiding the rotary shaft to move and lock and a second guide slot for guiding the rotary shaft to rotate; the locked section of the rotary shaft is sleeved with a connector pivotally connected with the shaft sleeve; a first positioning post is provided on the connector at a position corresponding to the first guide slot, a second positioning post is provided on the shaft sleeve at a position corresponding to the second guide slot. The quick locking piece has a simpler structure, which can improve the installation efficiency.

19 Claims, 8 Drawing Sheets

(51) Int. Cl.
  *F16B 9/02* (2006.01)
  *H05K 5/00* (2006.01)
  *H05K 5/02* (2006.01)
  *G09F 9/33* (2006.01)

(52) U.S. Cl.
  CPC ......... *H05K 5/0021* (2013.01); *H05K 5/0221* (2013.01); *G09F 9/33* (2013.01)

(56) References Cited

U.S. PATENT DOCUMENTS 8,708,595 B2 * 4/2014 Tseng .................... F16B 5/0092
  403/349
8,840,060 B2 * 9/2014 Soulier .................. B64D 29/06
  244/54

* cited by examiner

QUICK LOCKING PIECE AND DISPLAY SCREEN ASSEMBLY

TECHNICAL FIELD

The invention relates to a display screen coupling block, and more particularly, to a quick locking piece and a display screen assembly.

BACKGROUND

Due to excellent display effect and applicability, LED display screens have been widely used in the industries of stage, commercial shows, advertisements, exhibitions and other industries. The LED display screen is generally composed of smaller unit screens. When a larger display area is needed, it may possibly need to assemble several tens or even hundreds of unit screens for using together. Therefore, it is necessary to provide a coupling block on the display screen.

However, when the existing display screen coupling block is locked, the operator needs to complete the work of locking the coupling block through a plurality of separate operation actions usually. For example, for some locks, it is necessary to push the lock on one display screen firstly so as to be clamped into a lockhole of another display screen, and then clamp a buckle on the lock into a clamping position of another display screen, thus causing inconvenience to splice the display screens.

SUMMARY

The object of the present invention is to overcome the above-mentioned defects of the prior art and provide a quick locking piece and a display screen assembly.

To achieve the above object, the present invention provides a quick locking piece, comprising:

a shaft sleeve and a rotary shaft which are cooperatively installed;

the rotary shaft has a locked section and a sliding section, and the locked section is located at one end portion of the rotary shaft;

an outer contour surface of the sliding section is provided with a first guide slot for guiding the rotary shaft to move and lock and a second guide slot for guiding the rotary shaft to rotate;

the locked section of the rotary shaft is sleeved with a connector pivotally connected with the shaft sleeve; and a first positioning post is provided on the connector at a position corresponding to the first guide slot, and a second positioning post is provided on the shaft sleeve at a position corresponding to the second guide slot.

Preferably, the first guide slot is a bending slot, the bending slot has a guide section extending along an axis of the rotary shaft and a positioning section forming an included angle with the guide section, and the second guide slot is a helical slot spirally extending along the axis of the rotary shaft.

Preferably, the bending slot has a guide section extending along the axis of the rotary shaft and a positioning section extending along a circumferential direction of the rotary shaft, and an overall shape of the bending slot is rectangular.

Preferably, the guide section is disposed near a mounting position of the connector, the positioning section is disposed away from the mounting position of the connector, when an end portion of the first positioning post slides in the guide section, a lock is unlocked, and when the end portion of the first positioning post slides in the positioning section, the lock is locked.

Preferably, the first positioning post is inserted along a radial direction of the connector until an end portion of the first positioning post protrudes into the first guide slot.

Preferably, the second positioning post is inserted into the shaft sleeve along a radial direction of the shaft sleeve until an end portion of the second positioning post protrudes into the second guide slot.

Preferably, a third guide slot is provided on the connector at a position sleeved with the shaft sleeve, and the shaft sleeve is provided with a third positioning post disposed along a radial direction of the shaft sleeve, the third positioning post is inserted into the shaft sleeve along the radial direction of the shaft sleeve until an end portion of the third positioning post protrudes into the third guide slot.

Preferably, the first guide slot is disposed near the connector, and the second guide slot is disposed away from the connector.

Preferably, at least two of the first guide slot and the second guide slot are both provided.

Preferably, the locked section comprises a lock and a transition section, the transition section is used for connecting the locked section with the sliding section, and an outer diameter dimension of the lock is larger than an outer diameter of the transition section, and the lock has two locked surfaces disposed in parallel, an extension direction of the locked surface is parallel to an axis of the rotary shaft, and a size between the locked surfaces of the lock is smaller than a maximum outer diameter of the lock.

Preferably, the entire lock is in a mushroom-head shape, the lock has two locked surfaces disposed in parallel, and an extension direction of the locked surface is parallel to an axis of the rotary shaft, and the size between the locked surfaces of the lock is smaller than a maximum outer diameter of the lock.

Preferably, an end face of the lock toward the sliding section is provided with an inclined plane that is conducive to locking.

Preferably, the shaft sleeve is provided with a handle.

Preferably, an end portion of the connector is provided with a fixing block, and the connector is fixedly mounted on a display screen frame through the fixing block.

Preferably, a limiting structure located on the shaft sleeve is further provided, the limiting structure comprises a limiting block hinged to the shaft sleeve, an elastic member disposed at the hinged position, and a limiting portion disposed on the connector, the limiting portion is provided on the connector located in the shaft sleeve, and the elastic member applies a force, so that one end of the limiting block leans against the limiting portion to prevent the shaft sleeve from rotating relative to the connector.

Preferably, the shaft sleeve is provided with a hollow space for the limiting block to protrude into the shaft sleeve, and the shaft sleeve is also provided with a handle with a mounting slot, the mounting slot of the handle is communicated with the hollow space of the shaft sleeve, the limiting block is disposed in the mounting slot and one end of the limiting block protrudes from the hollow space into the shaft sleeve to lean against the limiting portion.

Preferably, the limiting portion is located on a peripheral wall of the connector.

Preferably, the limiting portion is a plane disposed on an outer wall of the connector.

Preferably, the number of the limiting portion is one or more, and when the number of the limiting portion is more, the multiple limiting portions are disposed at intervals.

The present invention also provides a display screen assembly, comprising a frame and a display screen module mounted in the frame, wherein one side of the display screen frame is provided with a quick locking piece, and the other side of the display screen frame is provided with a locking block, a lockhole is provided on the locking block, and the quick locking piece is connected with the locking block on the adjacent display screen frame, and the quick locking piece is any one of the quick locking piece mentioned above.

The present invention has the beneficial effects that: by disposing the rotary shaft and the shaft sleeve which are cooperatively installed, the connector is disposed on the shaft sleeve to position the rotary shaft in the shaft sleeve, and the first guide slot and the second guide slot are disposed on the rotary shaft, and the first positioning post is inserted in the connector to position the connector and the first guide slot, the second positioning post is inserted in the shaft sleeve to position the shaft sleeve and the second guide slot, and the shaft sleeve is connected with the connector through the third positioning post; in this way, when the connector is positioned on the display screen frame, after the shaft sleeve is rotated, since the connector is fixedly mounted on the display screen frame, the rotary shaft will not rotate relative to the shaft sleeve when the shaft sleeve is rotated, that is, the rotation of the shaft sleeve drives the second positioning post to move along the second guide slot; the actually produced effect is that the shaft sleeve rotates relative to the rotary shaft while the rotary shaft does not rotate; in the meanwhile, the first positioning post moves along the guide section of the first guide slot, and the rotary shaft protrudes from the shaft sleeve without any angle rotation, and the lock of the rotary shaft protrudes and then enters the lockhole of the locking block of the adjacent display screen frame; at this point, the first positioning post moves to a connected portion of the guide section and the positioning section, and the second positioning post moves to a tail end of the second guide slot and cannot move anymore. When the shaft sleeve is rotated again by an angle, the first positioning post slides in the positioning section, the second positioning post will drive the rotary shaft to rotate at an angle, so that the lock and the lockhole of the locking block are dislocated, and the lock is buckled on the locking block to realize the function of connecting two adjacent display frames. During the entire locking process, the operator does not need to move the quick locking piece or toggle other locks, and it only needs one operation to complete the extension and unlocking of the lock, that is, the connection or separation between the quick locking piece and the locking block on the display screen frame can be completed at once by rotating the shaft sleeve only. The quick locking piece of the present invention has a simpler structure than the quick locking piece in the prior art, which can greatly improve the installation efficiency, and is more convenient and labor-saving to use. In addition, the limiting block and the elastic member are provided, wherein the limiting block can limit the shaft sleeve to achieve the effect of locking the shaft sleeve, which can prevent the quick lock from being unlocked by mistake.

Figure 1:
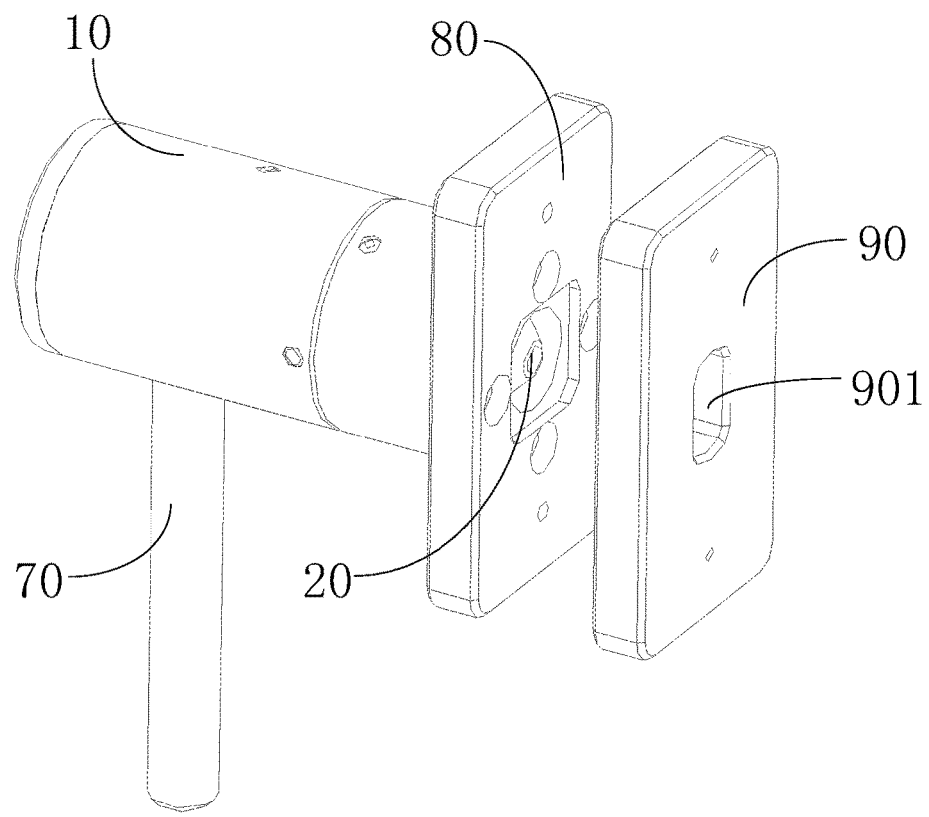
FIG. 1 is a schematic diagram of an overall structure of the present invention.

REFERENCE NUMERALS 10 refers to shaft sleeve; 20 refers to rotary shaft; 201 refers to locked section; 2011 refers to lock; 2012 refers to transition section; 2013 refers to locked surface; 2014 refers to inclined plane; 202 refers to sliding section; 203 refers to first guide slot; 2031 refers to guide section; 2032 refers to positioning section; 204 refers to second guide slot; 30 refers to connector; 301 refers to third guide slot; 302 refers to boss; 303 refers to limiting portion; 40 refers to first positioning post; 50 refers to second positioning post 50; 60 refers to third positioning post; 70 refers to handle; 80 refers to fixed block; 90 refers to locking block; 901 refers to lockhole; 100 refers to limiting block; and 110 refers to elastic member.

DETAILED DESCRIPTION

To describe the technical contents, the achieved objects, and the effects of the present invention in detail, the following description will be given with reference to the embodiments and the accompanying drawings.

The embodiments of the present invention will be described in detail hereinafter. Examples of the embodiments are shown in the accompanying drawings. The same or similar reference numerals throughout the drawings denote the same or similar elements or elements having the same or similar functions. The embodiments described below with reference to the accompanying drawings are exemplary and are intended to explain the present invention, but should not be construed as limiting the present invention.

Referring to FIG. 1 to FIG. 11, the present invention provides a quick locking piece, comprising: a shaft sleeve 10 and a rotary shaft 20 which are cooperatively installed; the rotary shaft 20 has a locked section 201 and a sliding section 202, and the locked section 201 is located at one end portion of the rotary shaft 20; an outer contour surface of the sliding section 202 is provided with a first guide slot 203 for guiding the rotary shaft 20 to move and lock and a second guide slot 204 for guiding the rotary shaft 20 to rotate; the locked section 201 of the rotary shaft 20 is sleeved with a connector 30 pivotally connected with the shaft sleeve 10; a first positioning post 40 is provided on the connector 30 at a position corresponding to the first guide slot 203, and a second positioning post 50 is provided at a position corresponding to the second guide slot 204.

In the above embodiment, by disposing the first guide slot 203 and the second guide slot 204 on the rotary shaft 20, and positioning the shaft sleeve 10 through the first positioning post 40 and the second positioning post 50, the shaft sleeve 10 rotates relative to the rotary shaft 20, and the third guide slot 301 disposed on the connector 30 is positioned with the third positioning post 60 of the shaft sleeve 10, the connector 30 and the shaft sleeve 10 cannot be separated, so that the rotary shaft 20 can be pushed out from the inside of the shaft sleeve 10 by only rotating the shaft sleeve 10, and the rotary shaft 20 after being pushed out is rotated, so as to complete an effect of locking the quick locking piece, so that the entire operation process of positioning and locking the rotary shaft 20 and a locking block 90 has only one rotation action, thus being capable of completing the quick connection between the display screens without excessive installation clamping or splicing actions, so that the installation is quicker; moreover, the quick locking piece comprises few components, for example, the quick locking piece is composed of the four major members only including the shaft sleeve 10, the rotary shaft 20, the connector 30, and the first positioning post 40, the second positioning post 50, and the third positioning post 60 (all the positioning costs are consistent in shape but slightly different in size), thus achieving the advantages of simple overall structure, easy maintenance, and low processing and production difficulty thereof.

Figure 2:
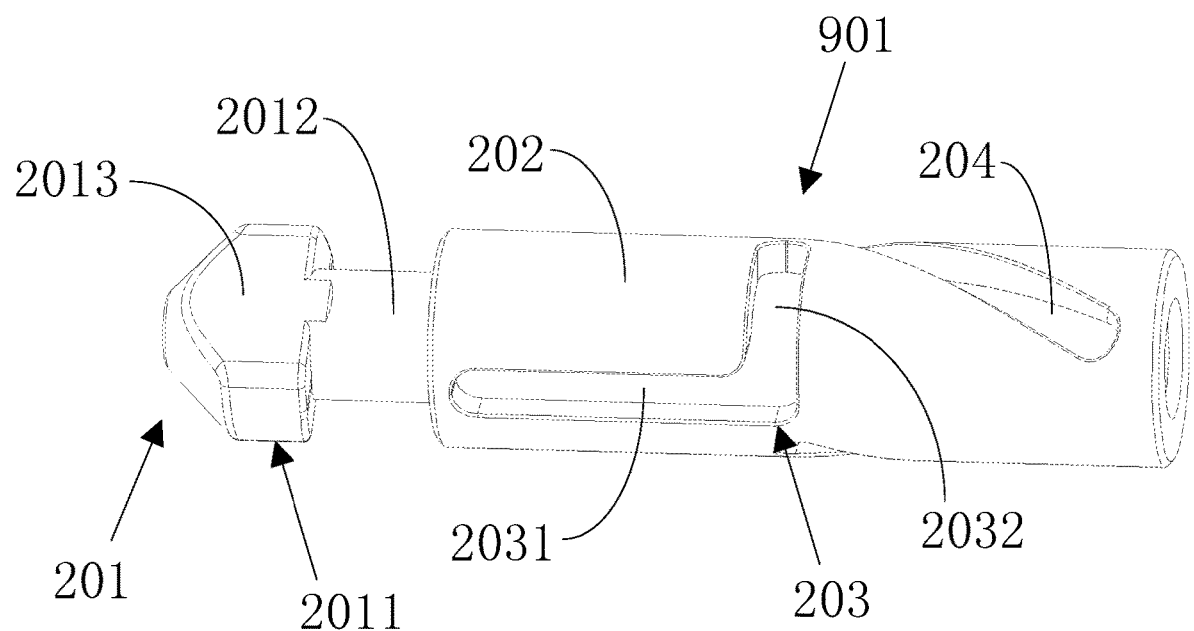
FIG. 2 is a structural schematic diagram of a rotary shaft of the present invention.

In a specific embodiment, with reference to FIG. 2, the first guide slot 203 is a bending slot, the bending slot has a guide section 2031 extending along an axis of the rotary shaft 20 and a positioning section 2032 forming an included angle with the guide section 2031, and the second guide slot 204 is a helical slot spirally extending along the axis of the rotary shaft 20. The first guide slot 203 can drive the rotary shaft 20 to rotate by an angle when the rotary shaft 20 protrudes outwardly of the shaft sleeve 10 and when the shaft sleeve 10 is rotated. The second guide slot 204 enables the shaft sleeve 10 along the rotary shaft 20 when the shaft sleeve 10 is rotated. In addition, the rotary shaft 20 can be moved and protruded without rotation at this time, especially when the first positioning post 40 moves in the guide section 2031, and when the first positioning post 40 moves in the positioning section 2032, the second positioning post 50 will push the rotary shaft 20 to rotate by an angle due to the rotation of the shaft sleeve 10; in addition, the rotary shaft may also be pushed to rotate by other angle, such as an acute angle or an obtuse angle. When an included angle between the guide section 2031 and the positioning section 2032 is an acute angle or an obtuse angle, there will be a certain clearance adjustment effect, and a gap between a lock 2011 of the rotary shaft 10 and a lockhole 901 of the locking block 90 can be adjusted, thus determining the locking tightness of the rotary shaft 10.

Figure 3:
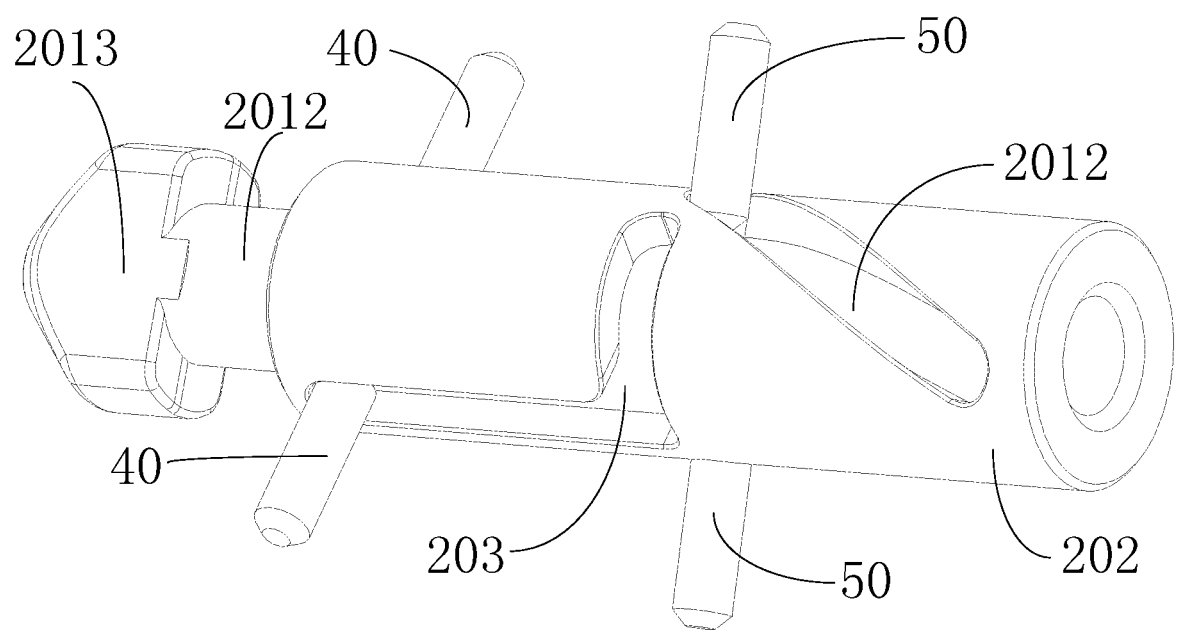
FIG. 3 is a schematic diagram showing the position installation of a rotary shaft, a first positioning post and a second positioning post of the present invention.

Further, with reference to FIG. 2 and FIG. 3, the bending slot has a guide section 2031 extending along the axis of the rotary shaft and a positioning section 2032 extending along a circumferential direction of the rotary shaft, and an overall shape of the bending slot is rectangular. In this way, the first positioning post 40 can move smoothly.

In a specific embodiment, with reference to FIG. 2 and FIG. 3, the guide section 2031 is disposed near a mounting position of the connector 30, the positioning section 2032 is disposed away from the mounting position of the connector 30, when an end portion of the first positioning post 40 slides in the guide section 2031, a lock 2011 is unlocked, and when the end portion of the first positioning post 40 slides in the positioning section 2032, the lock 2011 is locked.

In a specific embodiment, referring to FIG. 2 and FIG. 3, the first positioning post 40 is inserted along a radial direction of the connector 30 until an end portion of the first positioning post 40 protrudes into the first guide slot 203.

In a specific embodiment, referring to FIG. 2 and FIG. 3, the second positioning post 50 is inserted into the shaft sleeve 10 along a radial direction of the shaft sleeve 10 until an end portion of the second positioning post 50 protrudes into the second guide slot 204.

Figure 4:
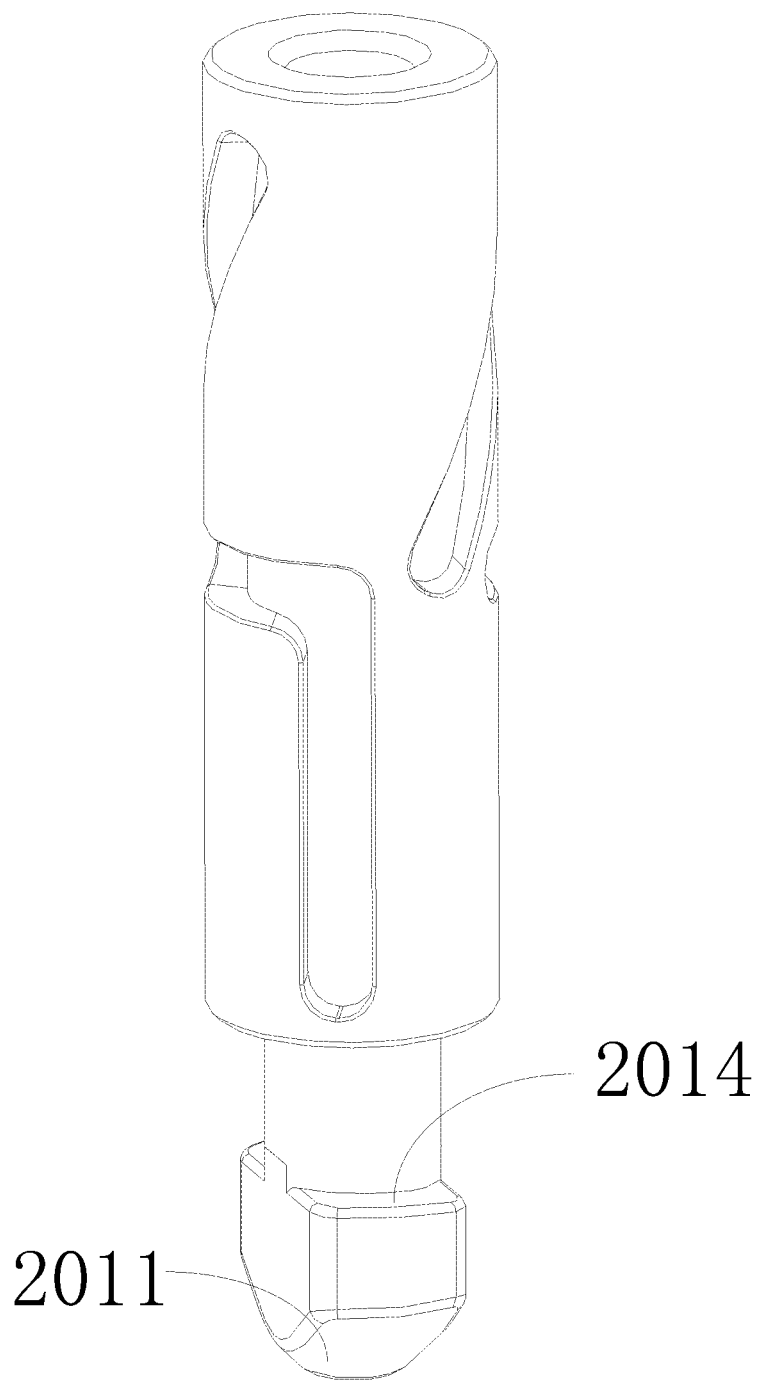
FIG. 4 is a structural schematic diagram of another angle of a rotary shaft of the present invention.
Figure 5:
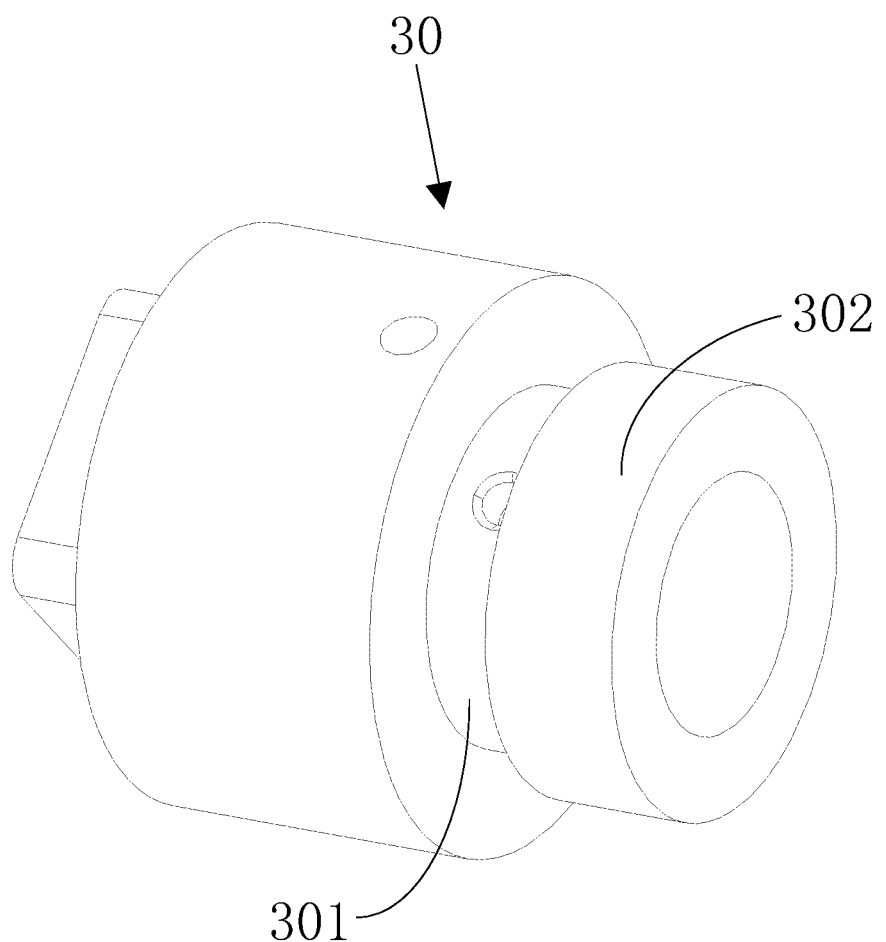
FIG. 5 is a structural schematic diagram of a connector of the present invention.

In a specific embodiment, with reference to FIG. 4 and FIG. 5, a third guide slot 301 is provided on the connector 30 at a position sleeved with the shaft sleeve 10, and the shaft sleeve 10 is provided with a third positioning post 60 disposed along a radial direction of the shaft sleeve, the third positioning post 60 is inserted into the shaft sleeve 10 along the radial direction of the shaft sleeve 10 until an end portion of the third positioning post 60 protrudes into the third guide slot 301.

Figure 6:
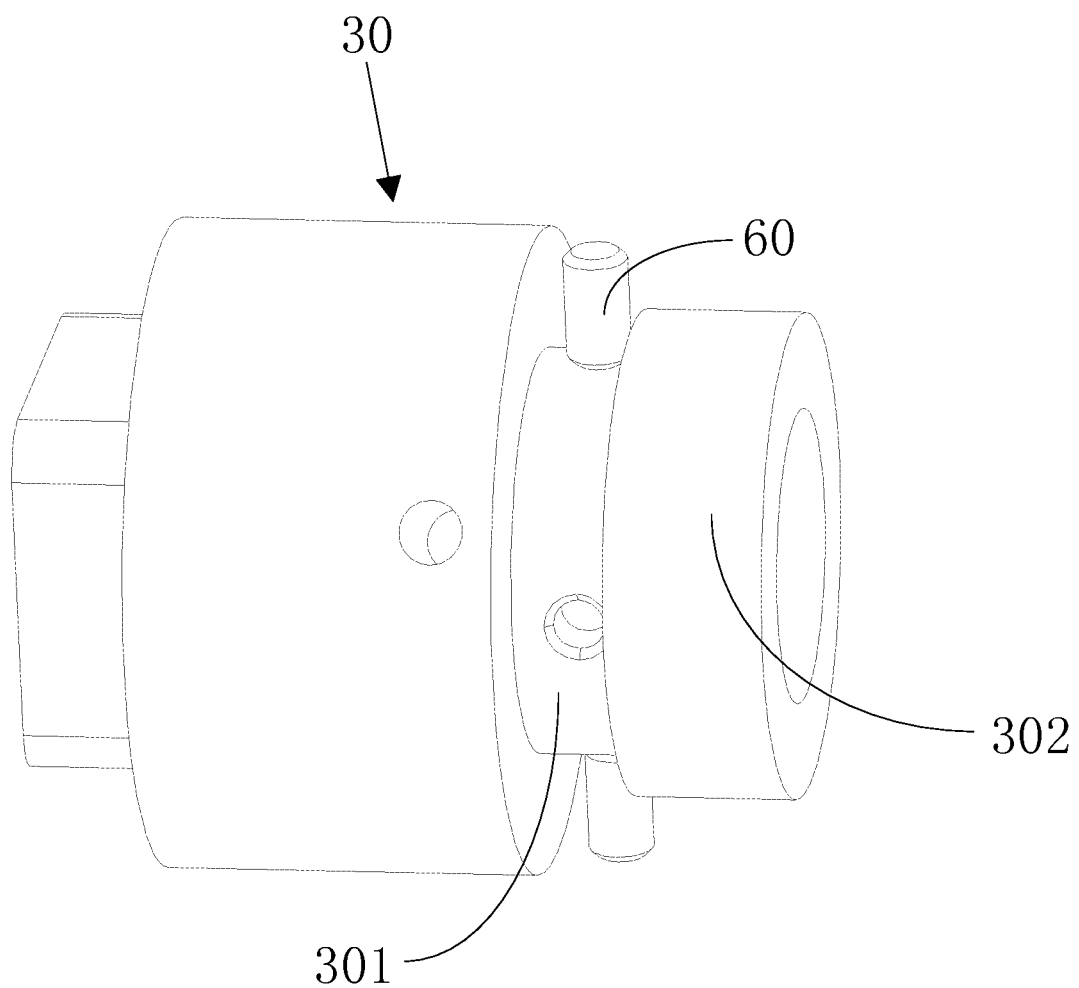
FIG. 6 is a schematic diagram of a positional installation of a connector and a third positioning post of the present invention.
Figure 7:
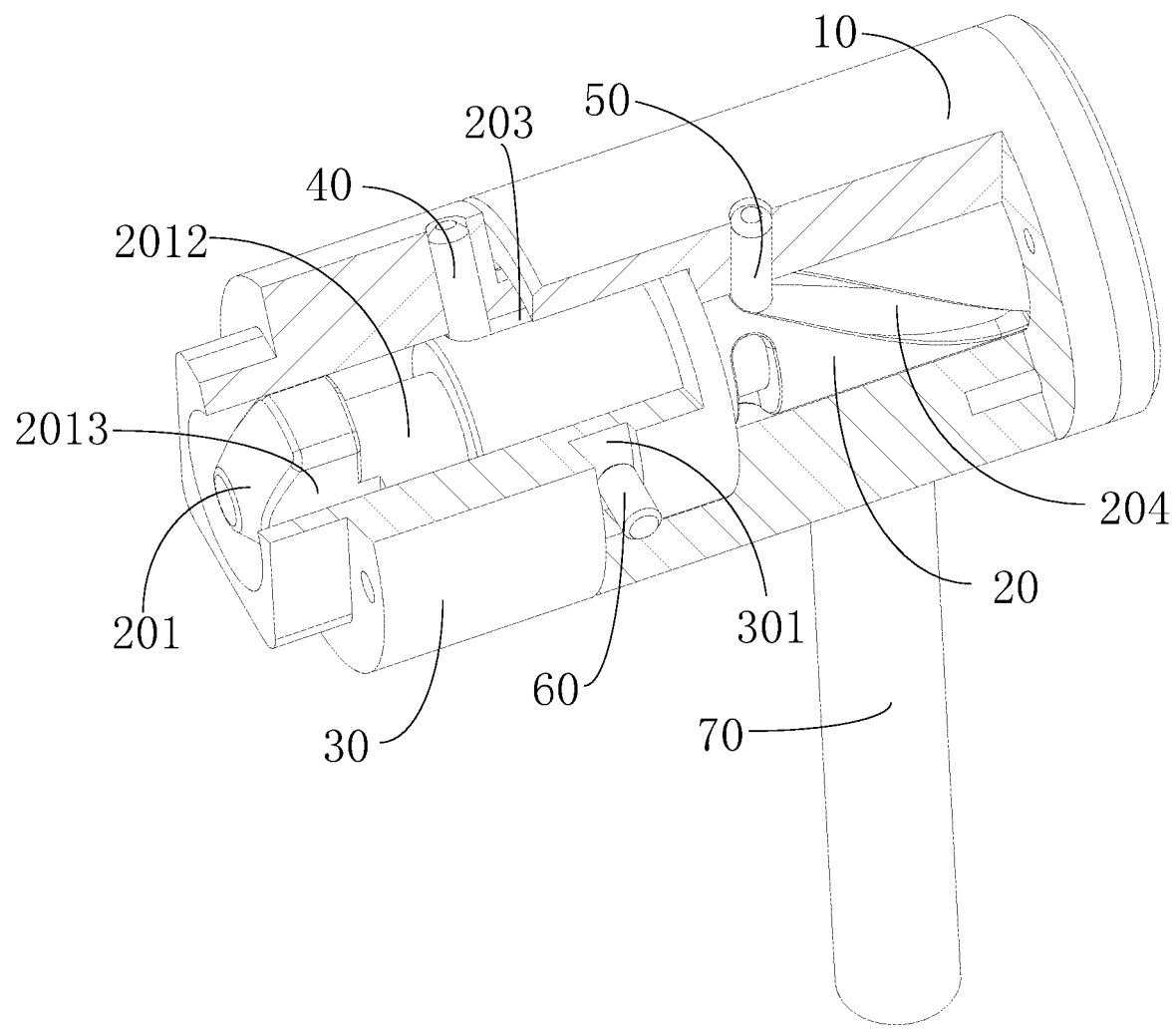
FIG. 7 is a partial sectional drawing of the present invention.

To be specific, with reference to FIG. 4, FIG. 5 and FIG. 6, the first positioning post 40, the second positioning post 50 and the third positioning post 60 are all in a cylindrical positioning pin shape; the first positioning post 40 is fixed on the connector 30 and protrudes toward an axial direction of the connector 30. Similarly, the second positioning post 50 is fixed on the shaft sleeve 10 and protrudes toward an axial direction of the shaft sleeve 10. The third positioning post 60 is disposed on the shaft sleeve 10 connected with the connector 30, and also protrudes toward the axial direction of the shaft sleeve 10. Preferably, a protruding boss 302 is disposed at one end of the connector 30, a circular slot is disposed on an outer edge surface of the boss 302, and the circular slot is a third guide slot 301. A stepped hole is disposed at one end of the shaft sleeve 10 and used for butting with the boss 302 of the connector 30. The third positioning post 60 is disposed on the shaft sleeve 10 at a position corresponding to the third guide slot 301, so that the third positioning post 60 is just inserted into the third guide slot 301; in this way, the shaft sleeve 10 and the connector 30 can be connected, and the connector 30 and the shaft sleeve 10 are pivotally connected and are inseparable.

Preferably, the first guide slot 203 is disposed near the connector 30, and the second guide slot 204 is disposed away from the connector 30. Since the first guide slot 203 acts to push the rotary shaft 20 out of the shaft sleeve 10, and a lock of the rotary shaft 20 protrudes from the connector 30, the first guide slot 203 needs to be disposed near a protruded position of the rotary shaft 20.

With reference to FIG. 2 and FIG. 3, further, at least two of the first guide slot 203 and the second guide slot 204 are both provided. Correspondingly, at least one first positioning post 40 is disposed in each first guide slot 203, and at least one second positioning post 50 is disposed in each second guide slot 204, which can facilitate the shaft sleeve 10 to keep force balance while rotating during a rotating process, so that the shaft sleeve 10 rotates smoothly.

Still further, with reference to FIG. 2, the locked section 201 comprises a lock 2011 and a transition section 2012, the transition section 2012 is used for connecting the locked section 201 with the sliding section 202, and an outer diameter dimension of the lock 2011 is larger than an outer diameter of the transition section 2012, and the lock 2011 has two locked surfaces 2013 disposed in parallel, an extension direction of the locked surface 2013 is parallel to an axis of the rotary shaft 20, and a size between the locked surfaces 2013 of the lock 2011 is smaller than a maximum outer diameter of the lock 2011. Preferably, the lock 2011 may be in a conical shape, a rectangular shape or other shapes as a whole, an outer contour dimension of the lock 2011 is larger than an outer diameter of the transition section 2012, and the two locked surfaces 2013 parallel to the axis of the rotary shaft 20 provided on the lock 2011 are used to connect the lock 2011 with the locking block 90 on the display screen frame.

With reference to FIG. 2, the entire lock 2011 is in a mushroom-head shape, the lock 2011 has two locked surfaces 2013 disposed in parallel, and an extension direction of the locked surface 2013 is parallel to an axis of the rotary shaft 20, and the size between the locked surfaces 2013 of the lock 2011 is smaller than a maximum outer diameter of the lock 2011. The lock 2011 is provided with two locked surfaces 2013; in this way, the entire lock 2011 may be in a flat shape, and is used to connect with the locking block 90 on the display screen, and the locking block 90 is provided with a flat narrow lockhole 901, which allows the lock 2011 to just pass through. In this way, when the rotary shaft 20 is rotated, a larger size of the lock 2011 will be clamped on a smaller size of the lockhole 901, and the lock 2011 will not be separated from the locking block 90, thereby connecting two adjacent display screens. To be specific, the lockhole 901 on the locking block 90 is an elongated shape adapted to the size of the lock 2011.

With reference to FIG. 4, an end face of the lock 2011 toward the sliding section 202 is provided with an inclined plane 2014 that is conducive to locking. To be specific, when the entire lock 2011 is in a mushroom-head shape, the inclined plane 2014 is located at a basal face of the lock 2011 in a mushroom-head shape, and the inclined plane 2014 inclines by an angle relative to a horizontal direction of the basal face. When the lock 2011 is rotated and locked, and when the inclined plane 2014 cooperates with the locking block 90 on another display screen, the inclined plane 2014 can clamp the lockhole 901 gradually from a loose manner to a tight manner when entering the lockhole 901 so as to achieve the object that the lock 2011 is rotated smoothly when it is just inserted into the lockhole 901, and can tighten and narrow a gap between the lock and the lockhole when it is to be locked, and the basal face of the lock 2011 will be clamped with the lockhole 901 when it is rotated in place.

In a specific embodiment, with reference to FIG. 1, the shaft sleeve 10 is provided with a handle 70, thus facilitating rotation of the shaft sleeve 10.

In a specific embodiment, with reference to FIG. 1, an end portion of the connector 30 is provided with a fixing block 80, and the connector 30 is fixedly mounted on a display screen frame through the fixing block 80. In order to facilitate the installation and disassembly of the quick locking piece, the fixing block 80 for connecting the quick locking piece with the display screen frame is disposed on the connector 30.

Figure 8:
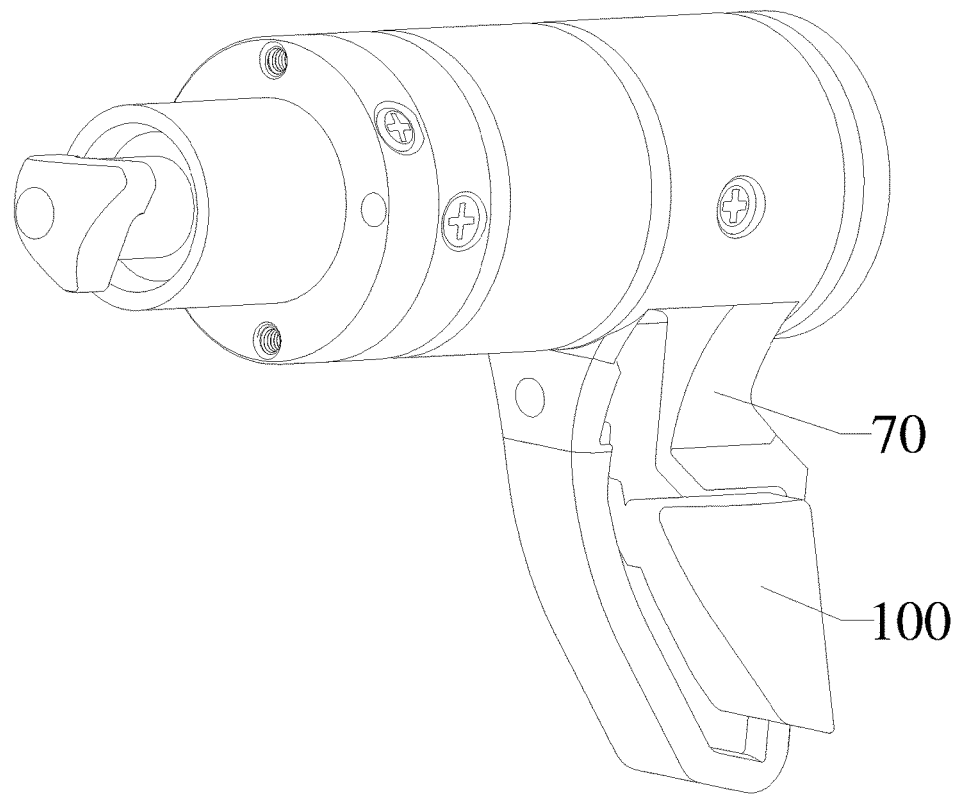
FIG. 8 is a schematic diagram of an overall structure of a quick locking piece according to another embodiment of the present invention (after hiding a locking block)
Figure 9:
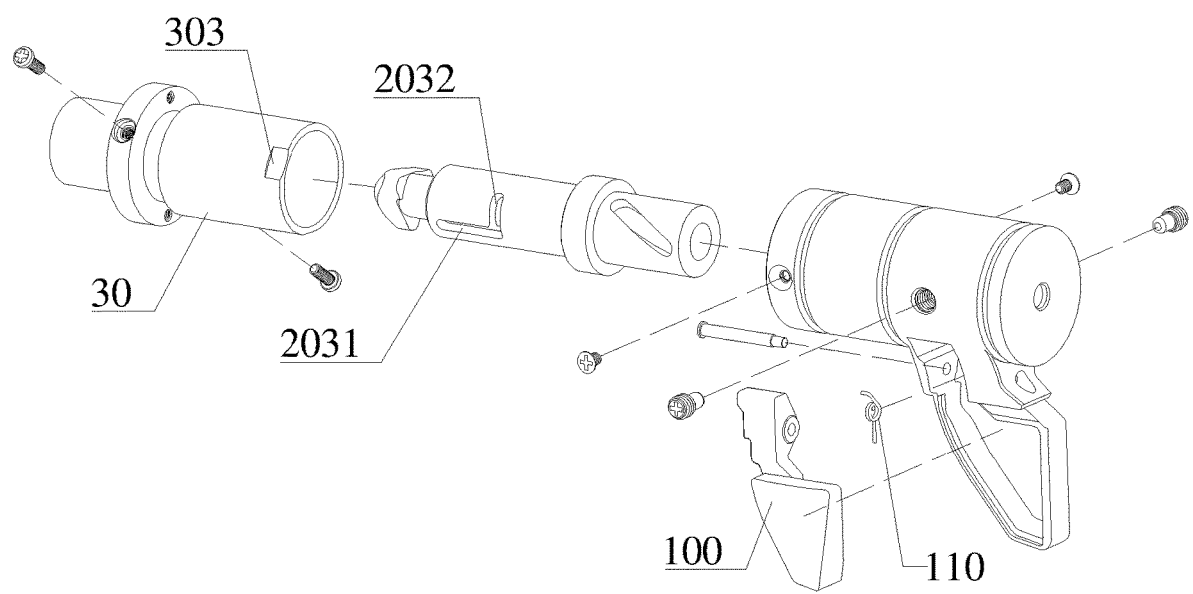
FIG. 9 is an exploded drawing of a quick locking piece according to another embodiment of the present invention.
Figure 10:
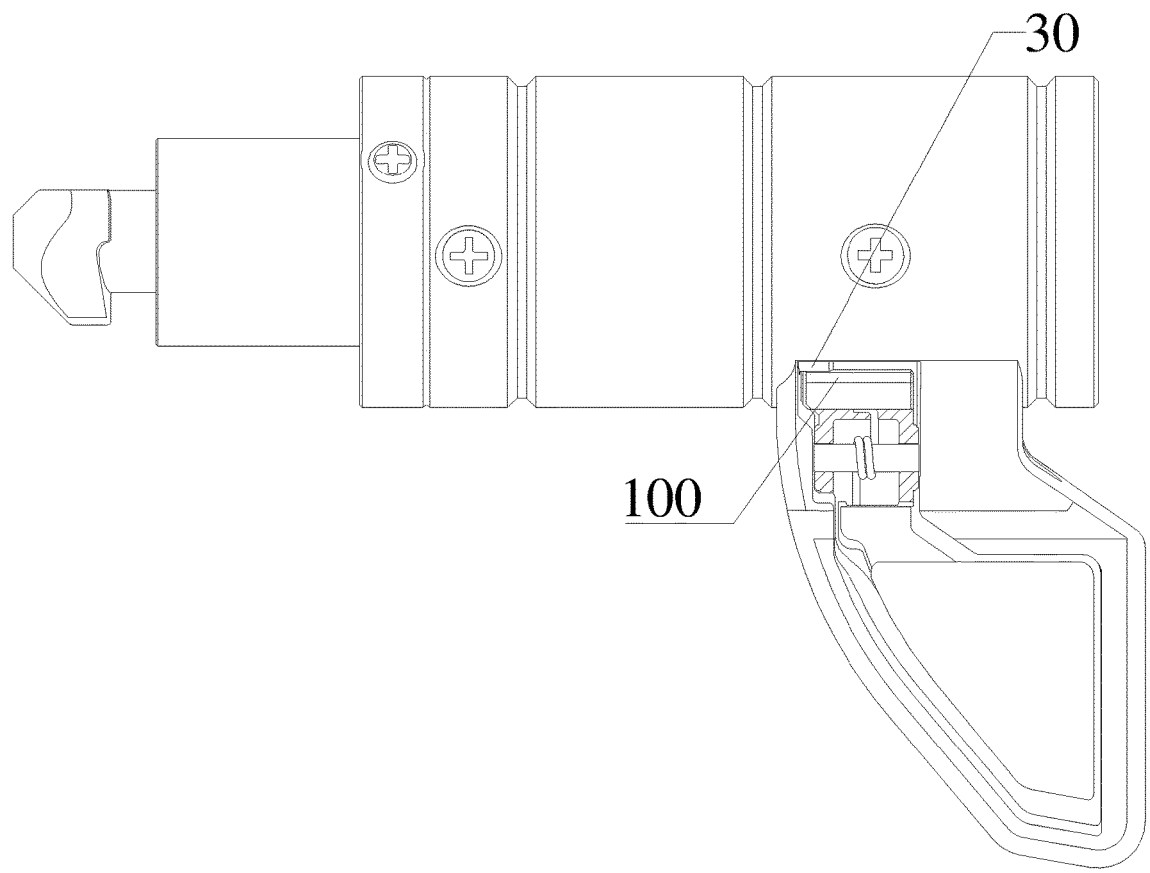
FIG. 10 is a partial sectional drawing of a quick locking piece according to another embodiment of the present invention.
Figure 11:
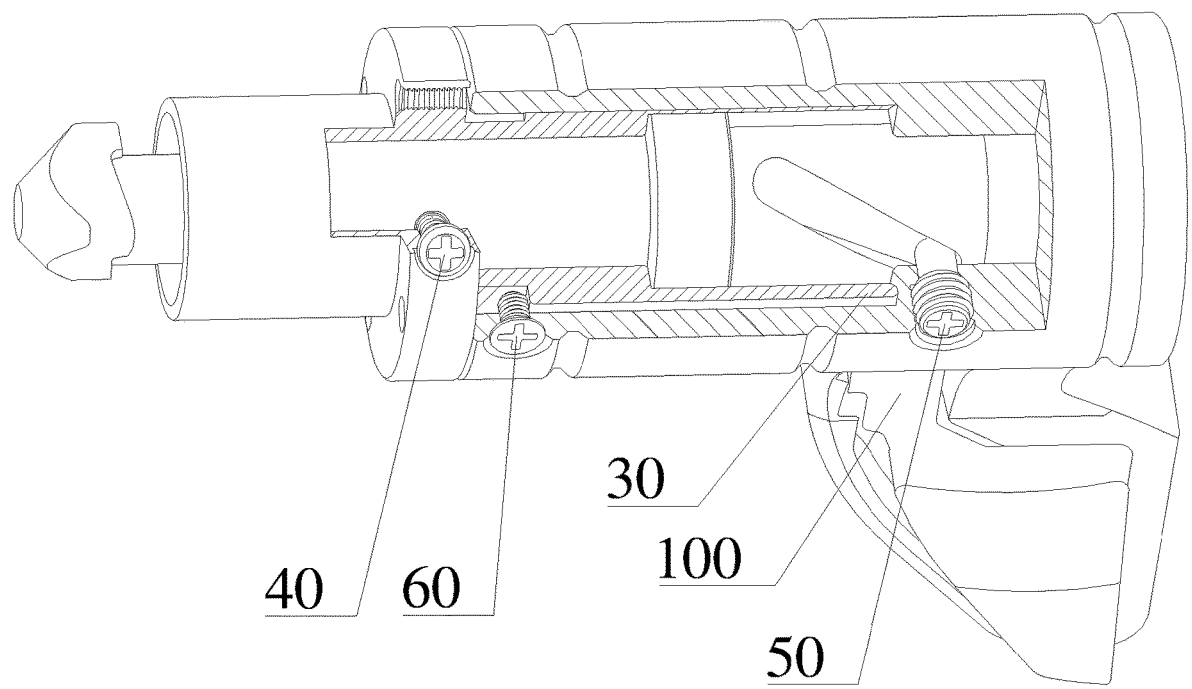
FIG. 11 is a partial sectional drawing of a quick locking piece according to another embodiment of the present invention.

With reference to FIG. 8 to FIG. 10, in a specific embodiment, the quick locking piece further comprises a limiting structure located on the shaft sleeve 10. The limiting structure comprises a limiting block 100 hinged to the shaft sleeve 10, an elastic member 110 disposed at the hinged position, and a limiting portion 303 disposed on the connector 30, the limiting portion 303 is provided on the connector 30 located in the shaft sleeve 10, and the elastic member 110 applies a force, so that one end of the limiting block 100 leans against the limiting portion 303 to prevent the shaft sleeve 10 from rotating relative to the connector 30.

The other end of the limiting block 100 is exposed out of the shaft sleeve 10. To be specific, one end of the elastic member 110 leans against the limiting block 100, and the other end of the elastic member 110 leans against the shaft sleeve 10. The elastic member 110 is a torsion spring preferably.

Optionally, the limiting portion 303 is located on a peripheral wall of the connector 30. To be specific, the limiting portion 303 is a plane disposed on an outer wall of the connector 30. When the quick locking piece is under an unlocked state, the limiting block 100 is pressed to make the limiting block 100 separate from the plane of the limiting portion 303; at the moment, the shaft sleeve is under a random rotating state; when the limiting block 100 is loosened, the limiting block returns back through the effect of the torsion spring, so that the limiting block 100 is contacted with the plane of the limiting portion 303; at the moment, the quick locking piece is under a locked state, and the shaft sleeve 10 cannot rotate relative to the connector 30.

The number of the limiting portion 303 is one or more, and when the number of the limiting portion 303 is more, the multiple limiting portions 303 are disposed at intervals. Preferably, the number of the limiting portion 303 is two, wherein one limiting portion 303 is corresponding to a situation that the first positioning post 40 is located at one end of the guide section 2031 far away from the positioning section 2032, and the other limiting portion 303 is corresponding to a situation that the first positioning post 40 is located at one end of the positioning section 2032 far away from the guide section 2031.

As an extension, the shaft sleeve is provided with a hollow space for the limiting block 100 to protrude into the shaft sleeve 10, and the shaft sleeve 10 is also provided with a handle 70 with a mounting slot, the mounting slot of the handle 70 is communicated with the hollow space of the shaft sleeve 10, the limiting block 100 is disposed in the mounting slot and one end of the limiting block 100 protrudes from the hollow space into the shaft sleeve 10 to lean against the limiting portion 303. An exposed portion of the limiting block 100 is located in an area of the mounting slot.

In the above embodiment, the mounting slot on the handle can receive the limiting block 100, so that the limiting block 100 does not protrude too much to affect the appearance and the overall size of the structure. The position of the limiting block 100 can be limited by the mounting slot, so that the free movement of the limiting block 100 during use is avoided. One end of the limiting block 100 protrudes into the hollow space of the shaft sleeve 10, so that the limiting block 100 can lock the connector 30. At this time, the shaft sleeve 10 will not rotate randomly during rotation.

On the basis of the quick locking piece above, the present invention also provides a display screen assembly, comprising a display screen frame and a display screen module mounted in the display screen frame. One side of the display screen frame is provided with a quick locking piece, the quick locking piece is connected with the display screen frame through a connector 30 thereof. The other side of the display screen frame provided with the quick locking piece is provided with a locking block 90, two adjacent display screen assemblies are connected with the locking block 90 through the quick locking piece, and the quick locking piece is any one of the quick locking piece mentioned above.

In a specific embodiment, the locking block 90 is provided with a lockhole 901 for allowing a lock 2011 to pass through. A size of the lockhole 901 is adapted to a size of the lock 2011.

In the actual application process, each display screen frame is provided with a locking block and a quick locking piece. The locking block and the quick locking piece are respectively disposed on two opposite sides of the display screen frame; when the two display screens are spliced, the locking blocks and the quick locking pieces on the sides of the two adjacent display screens can be just matched and locked.

The above description to the related function or effect of the present invention means that it has the function or effect, and it may also have other functions or effects. Therefore, it should not be regarded as improperly limiting the function or effect thereof.

Although the embodiments of the present invention have been shown and described above, it is to be understood that the above embodiments are exemplary and not to be construed as limiting the present invention. Persons of ordinary skill in the art may make variations, modifications, substitutions and modifications on the above-described embodiments within the scope of the present invention in the case of not departing from the principle and purpose of the present invention.

What is claimed is:

1. A quick locking piece, comprising:
    a shaft sleeve and a rotary shaft which are cooperatively installed;
    the rotary shaft has a locked section and a sliding section, and the locked section is located at one end portion of the rotary shaft;
    an outer contour surface of the sliding section is provided with a first guide slot for guiding the rotary shaft to move and lock and a second guide slot for guiding the rotary shaft to rotate;
    the locked section of the rotary shaft is sleeved with a connector pivotally connected with the shaft sleeve; and
    a first positioning post is provided on the connector at a position corresponding to the first guide slot, and a second positioning post is provided on the shaft sleeve at a position corresponding to the second guide slot;
    wherein the first guide slot is a bending slot, the bending slot has a guide section extending along an axis of the rotary shaft and a positioning section forming an included angle with the guide section, and the second guide slot is a helical slot spirally extending along the axis of the rotary shaft.

2. The quick locking piece according to claim 1, wherein the bending slot has a guide section extending along the axis of the rotary shaft and a positioning section extending along a circumferential direction of the rotary shaft, and an overall shape of the bending slot is rectangular.

3. The quick locking piece according to claim 1, wherein the guide section is disposed near a mounting position of the connector, the positioning section is disposed away from the mounting position of the connector, when an end portion of the first positioning post slides in the guide section, a lock is unlocked, and when the end portion of the first positioning post slides in the positioning section, the lock is locked.

4. The quick locking piece according to claim 1, wherein the first positioning post is inserted along a radial direction of the connector until an end portion of the first positioning post protrudes into the first guide slot.

5. The quick locking piece according to claim 1, wherein the first guide slot is disposed near the connector, and the second guide slot is disposed away from the connector.

6. The quick locking piece according to claim 1, wherein at least two of the first guide slot and the second guide slot are both provided.

7. The quick locking piece according to claim 1, wherein the locked section comprises a lock and a transition section, the transition section is used for connecting the locked section with the sliding section, and an outer diameter dimension of the lock is larger than an outer diameter of the transition section, and the lock has two locked surfaces disposed in parallel, an extension direction of the locked surface is parallel to an axis of the rotary shaft, and a size between the locked surfaces of the lock is smaller than a maximum outer diameter of the lock.

8. The quick locking piece according to claim 1, wherein the entire lock is in a mushroom-head shape, the lock has two locked surfaces disposed in parallel, and an extension direction of the locked surface is parallel to an axis of the rotary shaft, and the size between the locked surfaces of the lock is smaller than a maximum outer diameter of the lock.

9. The quick locking piece according to claim 8, wherein an end face of the lock near one end of the sliding section is provided with an inclined plane that is conducive to locking.

10. The quick locking piece according to claim 1, wherein the shaft sleeve is provided with a handle.

11. The quick locking piece according to claim 1, wherein an end portion of the connector is provided with a fixing block, and the connector is fixedly mounted on a display screen frame through the fixing block.

12. The quick locking piece according to claim 1, further comprising a limiting structure located on the shaft sleeve, the limiting structure comprises a limiting block hinged to the shaft sleeve, an elastic member disposed at the hinged position, and a limiting portion disposed on the connector, the limiting portion is provided on the connector located in the shaft sleeve, and the elastic member applies a force, so that one end of the limiting block leans against the limiting portion to prevent the shaft sleeve from rotating relative to the connector.

13. The quick locking piece according to claim 12, wherein the shaft sleeve is provided with a hollow space for the limiting block to protrude into the shaft sleeve, and the shaft sleeve is also provided with a handle with a mounting slot, the mounting slot of the handle is communicated with the hollow space of the shaft sleeve, the limiting block is disposed in the mounting slot and one end of the limiting block protrudes from the hollow space into the shaft sleeve to lean against the limiting portion.

14. The quick locking piece according to claim 12, wherein the limiting portion is located on a peripheral wall of the connector.

15. The quick locking piece according to claim 14, wherein the limiting portion is a plane disposed on an outer wall of the connector.

16. The quick locking piece according to claim 12, wherein the number of the limiting portion is one or more, and when the number of the limiting portion is more, the multiple limiting portions are disposed at intervals.

17. A display screen assembly, comprising a frame and a display screen module mounted in the frame, wherein one side of the display screen frame is provided with a quick locking piece, and the other side of the display screen frame is provided with a locking block, a lockhole is provided on the locking block, and the quick locking piece is connected with the locking block on the adjacent display screen frame, and the quick locking piece is the quick locking piece according to claim 1.

18. A quick locking piece, comprising:
    a shaft sleeve and a rotary shaft which are cooperatively installed;

the rotary shaft has a locked section and a sliding section, and the locked section is located at one end portion of the rotary shaft;

an outer contour surface of the sliding section is provided with a first guide slot for guiding the rotary shaft to move and lock and a second guide slot for guiding the rotary shaft to rotate;

the locked section of the rotary shaft is sleeved with a connector pivotally connected with the shaft sleeve; and a first positioning post is provided on the connector at a position corresponding to the first guide slot, and a second positioning post is provided on the shaft sleeve at a position corresponding to the second guide slot, wherein the second positioning post is inserted into the shaft sleeve along a radial direction of the shaft sleeve until an end portion of the second positioning post protrudes into the second guide slot.

19. A quick locking piece, comprising:

a shaft sleeve and a rotary shaft which are cooperatively installed;

the rotary shaft has a locked section and a sliding section, and the locked section is located at one end portion of the rotary shaft;

an outer contour surface of the sliding section is provided with a first guide slot for guiding the rotary shaft to move and lock and a second guide slot for guiding the rotary shaft to rotate;

the locked section of the rotary shaft is sleeved with a connector pivotally connected with the shaft sleeve; and a first positioning post is provided on the connector at a position corresponding to the first guide slot, and a second positioning post is provided on the shaft sleeve at a position corresponding to the second guide slot, wherein a third guide slot is provided on the connector at a position sleeved with the shaft sleeve, and the shaft sleeve is provided with a third positioning post disposed along a radial direction of the shaft sleeve, the third positioning post is inserted into the shaft sleeve along the radial direction of the shaft sleeve until an end portion of the third positioning post protrudes into the third guide slot.

* * * * *